United States Patent [19]
Cantarini et al.

[11] Patent Number: 5,973,257
[45] Date of Patent: Oct. 26, 1999

[54] REFLECTOR LAYER FOR THE WELL SURFACE OF A PHOTOVOLTAIC GENERATOR

[75] Inventors: William F. Cantarini, Redondo Beach; Steven C. Lizotte, Long Beach, both of Calif.

[73] Assignee: International Rectifier Corp., El Segundo, Calif.

[21] Appl. No.: 09/023,308

[22] Filed: Feb. 13, 1998

Related U.S. Application Data

[60] Provisional application No. 60/039,690, Feb. 13, 1997.

[51] Int. Cl.$^6$ ........................................ H01L 31/05
[52] U.S. Cl. ........................ 136/249; 438/73; 438/406
[58] Field of Search ...................... 136/249 MS; 438/73, 438/406

[56] References Cited

U.S. PATENT DOCUMENTS

| | | |
|---|---|---|
| 4,490,729 | 12/1984 | Douglas . |
| 5,032,529 | 7/1991 | Beitman et al. . |
| 5,084,130 | 1/1992 | Yamazaki et al. . |
| 5,176,789 | 1/1993 | Yamazaki et al. . |
| 5,342,808 | 8/1994 | Brigham et al. . |
| 5,459,099 | 10/1995 | Hsu . |
| 5,474,949 | 12/1995 | Hirao e al. . |
| 5,549,762 | 8/1996 | Cantarini ................................ 136/249 |
| 5,658,472 | 8/1997 | Bartha et al. . |

*Primary Examiner*—Mark Chapman
*Attorney, Agent, or Firm*—Ostrolenk, Faber, Gerb & Soffen, LLP

[57] ABSTRACT

A photovoltaic generator device for producing an output sufficient to turn on a MOS-gated device consists of a plurality of planar photogenerator cells connected in series. Each of the photovoltaic generator cells is contained on its own respective insulated tub. The insulated tubs are formed by wafer bonding a device wafer to a handle wafer with a dielectric isolation layer between them. Prior to joining the two wafers, a reflective layer is deposited on the surface of the device wafer to maximize absorption of incident light by the photogenerator cell. The individual tubs are isolated by trenches which enclose each tub and which extend through the reflective and to the dielectric layers between the device and handle wafers. Each tub is formed of an $N^-$ body having a shallow $P^+$ diffusion. $N^+$ contact regions are formed in the $N^-$ body and contact strips connect the devices of each of the tubs in series by connecting the $P^+$ diffusions of one tub to the $N^+$ contact of an adjacent tub. Alternatively, the isolation trenches are formed in the device wafer prior to bonding the two wafers, and the reflective layer is deposited on both the walls of the trenches and the surface of the device wafer to further increase light absorption.

32 Claims, 8 Drawing Sheets

GRIND AND POLISH TO HERE

REFLECTOR LAYER FOR THE WELL SURFACE OF A PHOTOVOLTAIC GENERATOR

RELATED APPLICATIONS

This application claims the priority of Provisional Application Ser. No. 60/039,690, filed Feb. 13, 1997.

BACKGROUND OF THE INVENTION

This invention relates to photovoltaic generators for producing a control signal for the control of a semiconductor switching device and, more specifically, relates to novel photovoltaic generator structures and methods for making such structures in which an array of planar cells formed in a silicon substrate are dielectrically isolated from one another by trench isolation.

Photovoltaic generators (PVG) are well known and are commonly used for producing a control signal for a solid state relay. Such devices employ an LED which is energized by input terminals to irradiate the photosensitive surface of a spaced and insulated photovoltaic device. The output of the photovoltaic device may serve as the input to a switching device, such as a MOS-gated device, typically a power MOSFET, which has load terminals which are switched "on" in response to the energization of the LED. The input and output terminals of the relay are isolated by the gap between the LED and the photovoltaic device. Commonly, the photovoltaic device consists of a large number of series-connected photovoltaic cells in order to produce a voltage sufficiently high to turn on the power switching device. Such devices are well known and are sold under the name "PVI" (photovoltaic isolator) by the International Rectifier Corporation of El Segundo, Calif., the assignee of the present invention.

Figure 1:
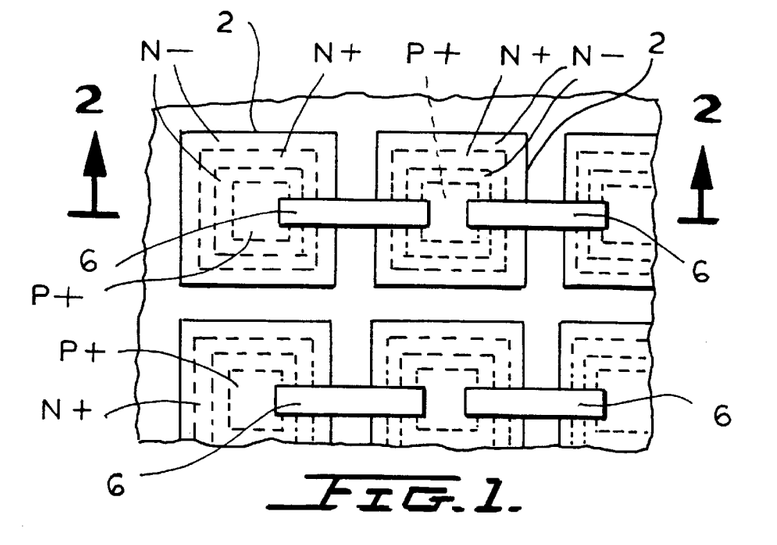
FIG. 1 shows a top view of a trench-isolated PVG device.
Figure 2:
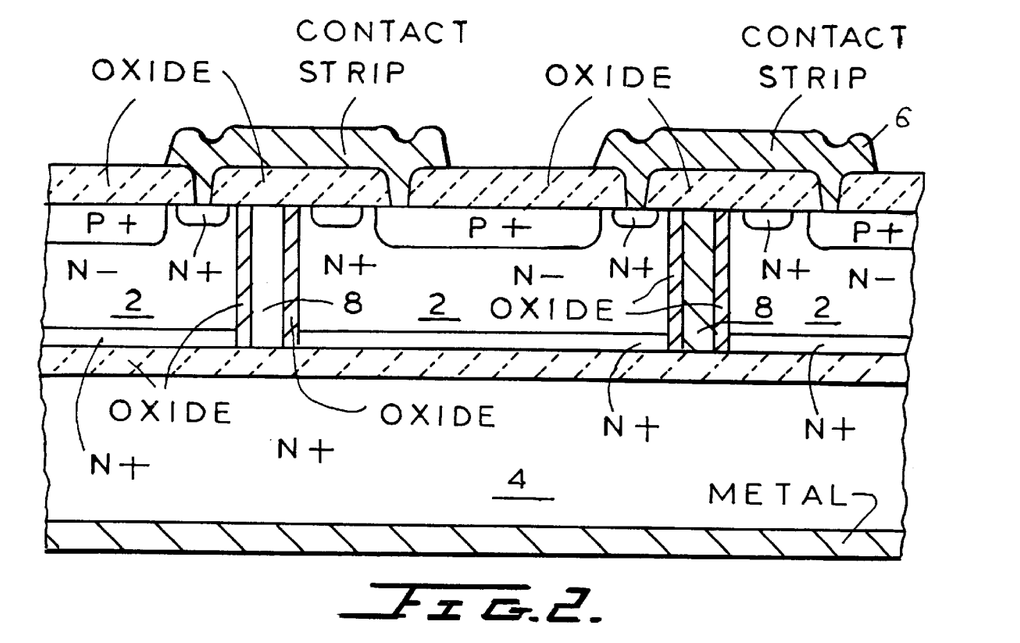
FIG. 2 shows a side view of the device of FIG. 1, taken through the line 2—2.

Plural cell photovoltaic generators can be made in many different ways. U.S. Pat. No. 5,549,762, issued to William F. Cantarini, one of the present inventors, on Aug. 27, 1996, the disclosure of which is incorporated herein by reference, describes a PVG device and method for making the same in which an array of planar cells 2 formed in a silicon substrate 4 are dielectrically isolated from one another by trench isolation. FIG. 1 shows a top view of such a trench isolated PVG device including contacts 6 to connect the cells 2 in series. FIG. 2 shows a cross-sectional side view of the device of FIG. 1 which includes polysilicon-filled trenches 8 which isolate the cells of the device.

To provide enough output current from a photovoltaic generator (PVG), sufficient surface area and depth of silicon need to be exposed to radiation. Experimentation and calculations have shown that greater than 80% of the incident light (typically 880 nm) can be absorbed in 20 nm of silicon. Reduction of this depth dramatically affects the absorption and hence output current. To maximize output current, it would be desirable to form a trench-isolated PVG device with increased absorption of incident light.

SUMMARY OF THE INVENTION

The present invention provides a trench-isolated PVG structure and method for making the same which includes a reflective layer on the surface of the PVG wells to maximize absorption of incident light by the PVG cell.

Specifically, in accordance with a first embodiment of the invention, the bottom surface of the dielectrically isolated wells forming the PVG device (each well containing a PVG cell) includes a layer of tungsten silicide, such that any light reaching the bottom of the cell is reflected and is absorbed by the silicon as it makes its way back towards the surface. This advantageously allows reduction of the silicon depth without any loss of light absorption or reduction of photo-current generated.

A layer of reflective material is deposited atop the surface of a junction receiving or device wafer that is lightly doped and of one conductivity type. The junction receiving wafer is joined to a relatively thick handle wafer by a thin dielectric bonding layer so that the layer of reflective material is disposed between the thin dielectric layer and the junction receiving wafer. A mesh-shaped trench is patterned and etched and extends from an outer surface of the junction receiving wafer up through the layer of reflective material to divide the wafer into plural tubs. The trench is then filled with an insulator. Impurities of an opposite conductivity type are introduced into a region of the outer surface of each of the tubs to form a relatively shallow diffusion region so that radiation which reaches the junction between the shallow diffusion region and the lightly doped material of the tub generates an output photovoltaic voltage. An overlaying insulating layer is deposited atop the outer surface of the junction receiving wafer, and portions of the layer are patterned and etched away to form at least one opening to each of the shallow diffusion region and the body in each of the tubs. A metal layer is deposited, and then portions are patterned and etched away to form connector electrodes that connect the shallow diffusion of a respective tube to the lightly doped material of an adjacent tub.

In a second embodiment of the invention, a layer of tungsten silicide is provided on the trench sidewalls, in addition to the bottom of the PVG wells, to further increase light absorption.

A mesh-shaped thin trench is patterned and etched into an outer surface of the junction receiving wafer. A layer of reflective material is deposited atop the outer surface of the wafer and on at least the walls of the trench. The trench is then filled with an insulator, and the junction receiving wafer is then joined to a relatively thick handle wafer by a thin dielectric bonding layer disposed between the outer surface of the junction receiving wafer and the handle wafer. A portion of the junction receiving wafer is removed from an opposing surface at least until the trench is reached. The photovoltaic generator is then processed in the manner described above.

Other features and advantages of the present invention will become apparent from the following description of the invention which refers to the accompanying drawings.

DETAILED DESCRIPTION OF THE PREFERRED EMBODIMENTS

Figure 3:
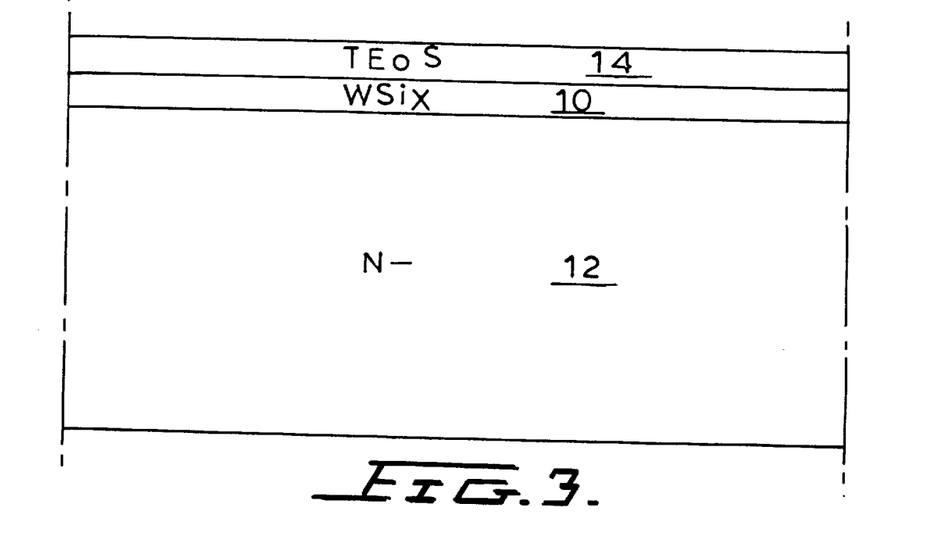
FIGS. 3–9 show the manufacturing steps for forming a trench-isolated PVG device with a reflective coating on the bottom of the wells in accordance with a first embodiment of the invention.

Referring first to FIG. 3, the process for making a PVG with a reflective film in the bottom of the wells begins with the CVD deposition of a 3000 Å layer 10 of tungsten silicide (WSi$_x$) on an N$^-$ silicon device wafer 12 formed of doped monocrystalline silicon. The tungsten silicide layer 10 is preferably "capped" with a deposition of a TEOS layer 14. It should be noted that a silicon dioxide layer at a thickness related to the wavelength of light being reflected (800 Å or 4500 Å), or other insulation layer including silicon nitride and the like (not shown), can be formed atop silicon wafer 12 prior to depositing the reflective layer or film for contamination control and the like.

Figure 4:
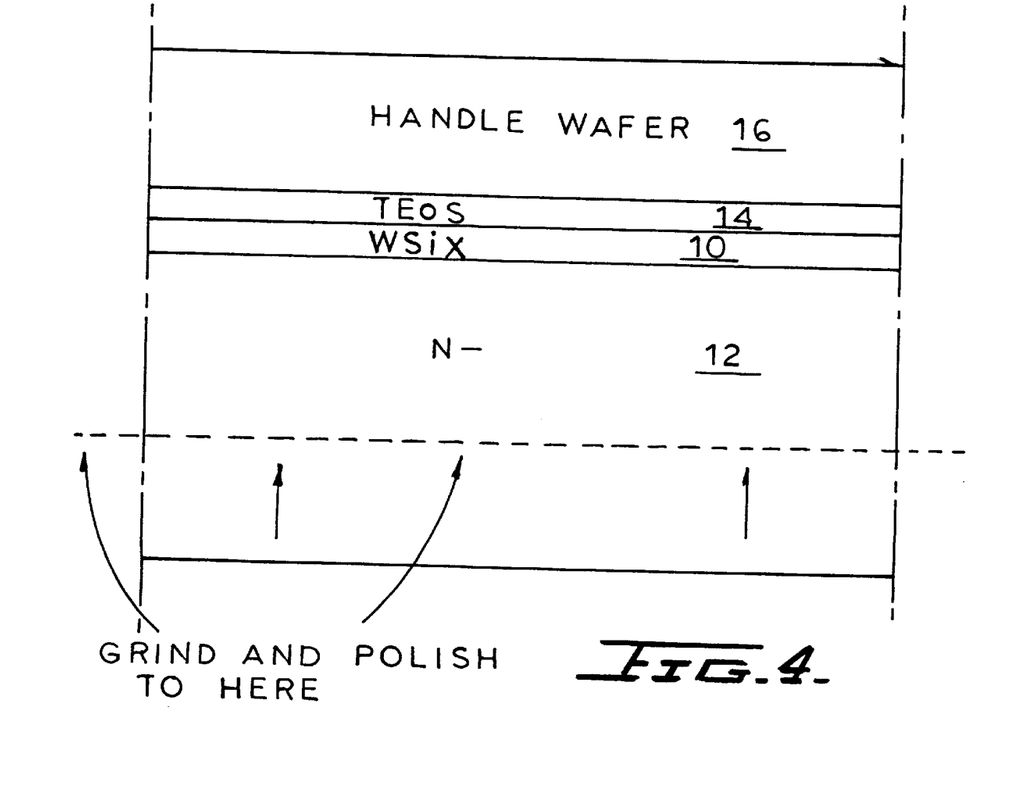

Then, as shown in FIG. 4, the wafer with deposited layers of tungsten silicide 10 and TEOS 14 is bonded to an N$^+$ type handle wafer 16 or any other desired handle wafer. Note that in a modified embodiment of the invention that the reflective layer can be formed directly on the handle wafer. Any desired known process can be used to bond wafers 12 and 16. Such processes are described, for example, in Wafer Bonding Technique etc. by Abe et al. in the publication Solid State Technology, November 1990, pages 39, 40 and in Silicon Wafer Bonding etc. by Abe et al. in Proceedings of 4th Intl. Symposium On Silicon-On-Insulator Technology and Devices, May 6–11, 1990, Montreal.

Figure 5:
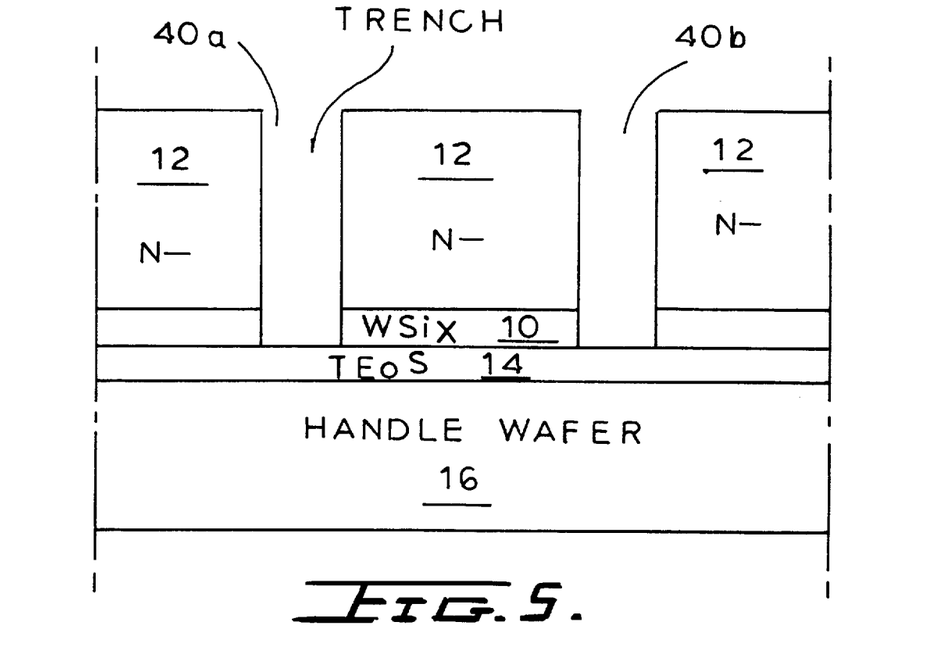

The "device" wafer, namely the wafer with the WSi$_x$ and TEOS films, is then ground and polished to the required thickness. The isolation trench is then etched through the tungsten silicide film, as shown in FIG. 5. The device wafer 12 is processed to form a grid of deep trench isolations which extend to the TEOS 14. Portions of the trench are shown in FIG. 5 in cross-section as portions 40a and 40b. The trenches create dielectrically isolated "tubs" in device wafer 12, each of a surface area of about 10 mils by 10 mils with a trench depth which typically may be 20 to 25 micrometers. Other dimensions can be used. Additional processing is then done in the manner disclosed in U.S. Pat. No. 5,549,762 to complete the PVG device.

Figure 6:
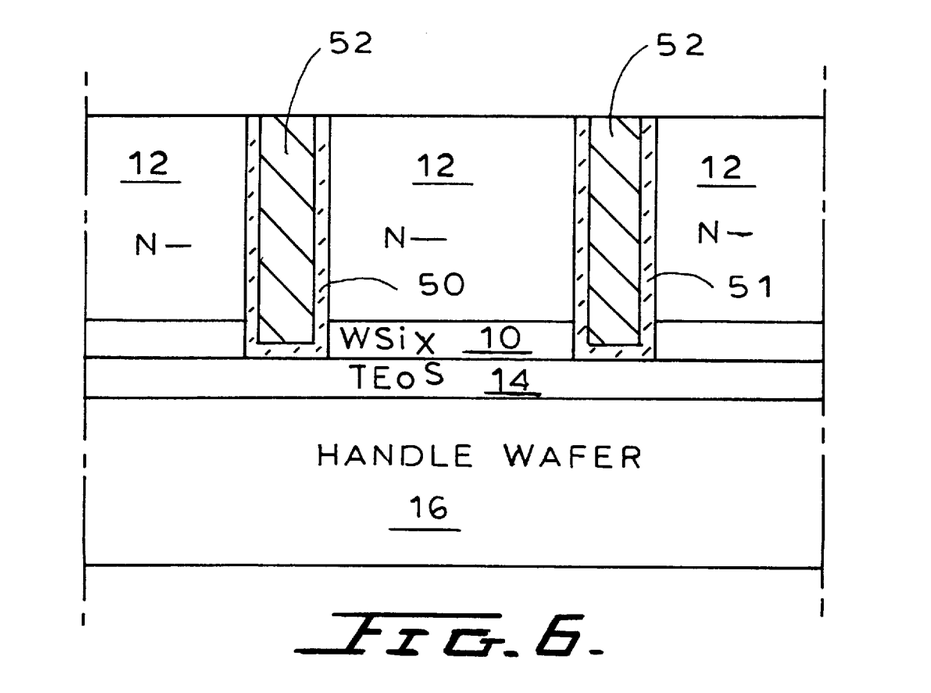

Specifically, after the trench array 40 is formed, an oxide layer is deposited on its interior walls, shown in FIG. 6 as oxide layers 50 and 51, and the central gap between them is then filled with polysilicon 52. Thus, a plurality of identical dielectrically isolated photogenerator cells is formed in wafer 12. The thickness of the oxides or other dielectric 50 and 51 is chosen to optimize reflectance of radiation at the interface with the silicon 12. The choice of dielectric further improves the efficiency of the device.

After forming the dielectrically isolated tubs of FIG. 6, diffusions forming the photovoltaic cells are formed in the surface of wafer 12. Using suitable photolithography techniques, an array of rectangular or other shaped shallow P$^+$ diffusions 20 and square ring-shaped N$^+$ contact diffusions 25, shown in FIG. 7, which encircle P$^+$ diffusions 20 to 24 respectively, are formed in wafer 12. Typically, for a wafer which is 5 inches in diameter, 88,000 spaced P$^+$ diffusions may be formed across the wafer to make about 9,000 die. Obviously, the P and N conductivity types can be interchanged.

Figure 7:
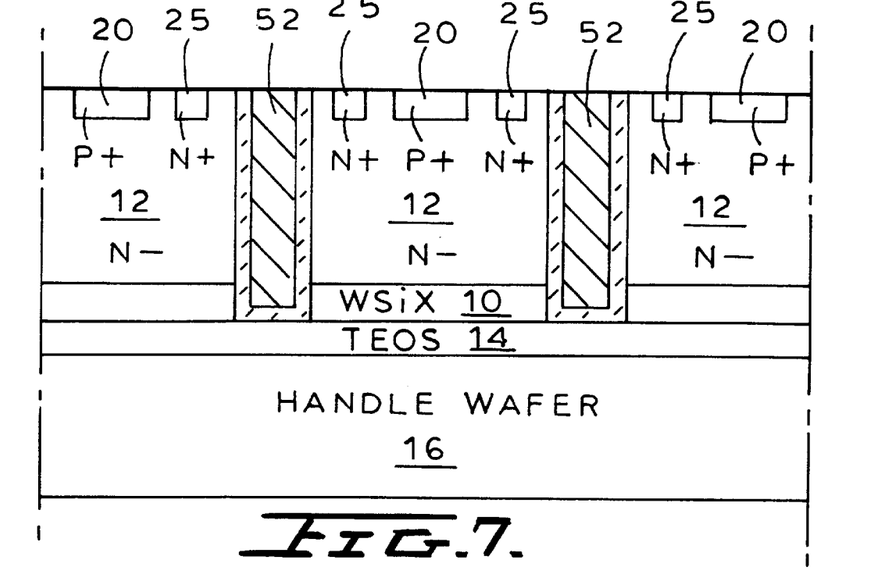

In a preferred embodiment of the invention, P$^+$ regions 20 have a depth of 2 micrometers and an area of 9 mils by 9 mils. The P$^+$ regions may be formed by an implant dose of boron of 5E18 per cm$^2$ with a peak concentration of 5E18 per cm$^3$.

Figure 8:
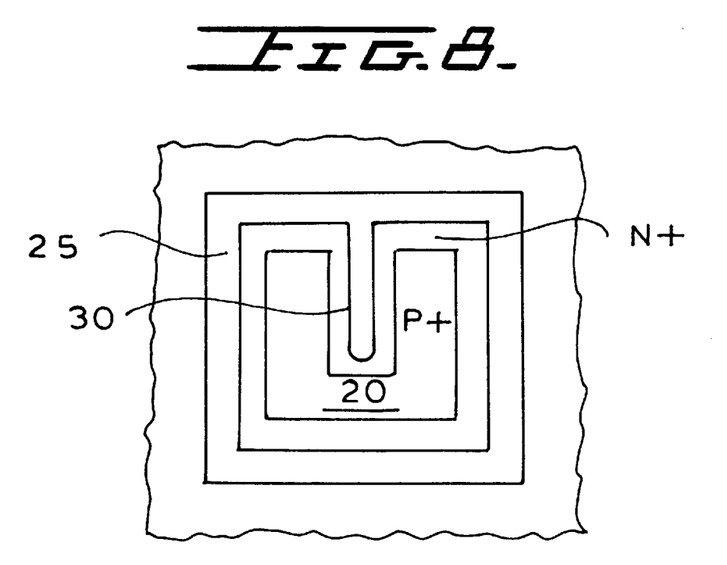

The N$^+$ rings 25 have a depth of 1 micrometer and a width of 0.5 mil and an inner circumference of 34 mils. Rings 25 may be formed of an arsenic implant at a dose of 8E15 per cm$^2$ with a peak concentration of 4E20 per cm$^3$. A central N$^+$ collecting finger 30, shown in FIG. 8 for ring 25, can be disposed at the center of each P$^+$ diffusion. Finger 30 may have a width of 0.5 mil and a length of about 7 mils.

Figure 9:
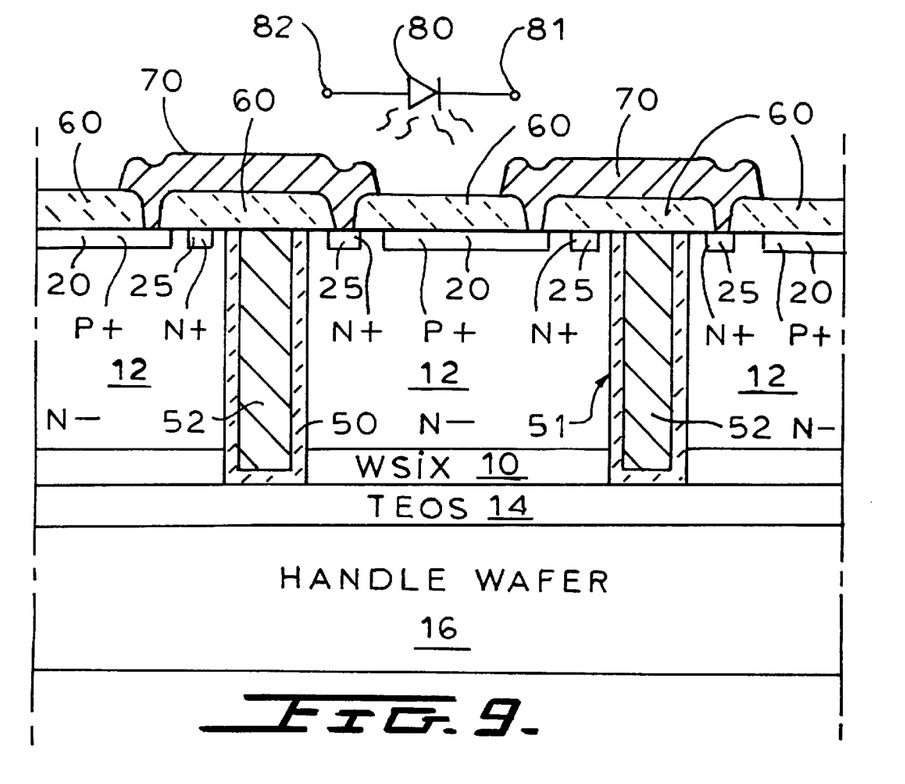

As next shown in FIG. 9, an oxide layer 60 is deposited atop the surface of wafer 11. A contact mask step then patterns the oxide to form contact openings to the N$^+$ and P$^+$ regions. Thereafter, a contact metal is deposited atop the oxide layer 60 and the metal is etched to form contact strips 70, 71 to connect the P$^+$ diffusion of one cell to the N$^+$ contact diffusion of an adjacent cell.

After the device is completed, the wafer may be coated with a protective transparent coating. The wafer is thereafter diced with each unit containing 16 series connected cells which have respective solder pad terminals (not shown) to produce devices which can produce 7 volts and 2.5 microamperes when illuminated by an LED.

Thus, the individual devices may be mounted with an LED 80 (in FIG. 9) insulated therefrom but arranged to produce radiation which illuminates the surface of the wafer or chip. The LED 80 is turned on by a suitable input to its terminals 81 and 82 which are dielectrically insulated from the output terminals of the chip. Any suitable LED can be used.

If desired, the PVG structure described above (except for the LED) can be integrated into the same chip which contains the power MOS-gated device to be controlled by the photogenerator structure. Alternatively, the device of FIGS. 8 and 9 employs a larger area P$^+$ diffusion, the N$^-$ wafer 12 has a resistivity greater than about 27 ohm centimeters, and only a small N$^+$ contact diffusion is employed which is 1 micrometer deep but only 0.5 mil by 0.5 mil. Further, the interior walls of trenches 40a and 40b receive a thin N$^+$ coating formed, for example, by diffusion from POCl, to a depth of about 5 micrometers and with a surface concentration of about 2E18 per cm$^3$.

It should be noted that, in addition to providing an optically reflective film, the tungsten silicide layer 10 on the bottom of each of the PVG wells advantageously provides an electrically conductive film which is useful in the collection of electrons generated in the silicon.

A "back surface field" may also be implemented with the addition of an N$^+$ buried layer at the bottom of the device wafer 12.

The embodiment of the invention described above and shown in FIGS. 3–9 provides a WSi$_x$ reflective layer on the bottom of the PVG wells. In a second embodiment of the invention, a WSi$_x$ reflective layer is formed not only on the bottom, but also on the sidewalls of each of the PVG wells.

Figure 10:
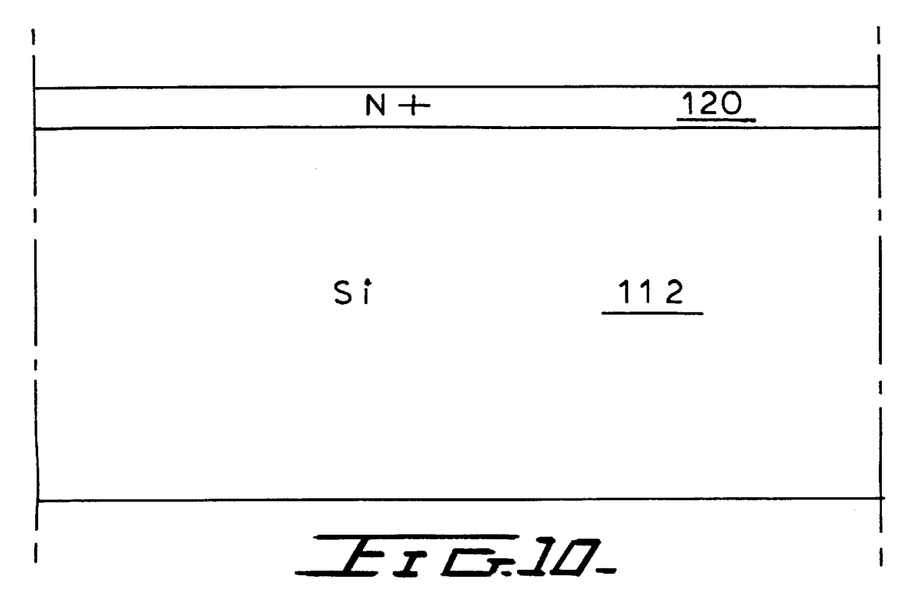
FIGS. 10–16 show the manufacturing steps for forming a trench-isolated PVG device with a reflective coating on the sidewalls of the wells in accordance with a second embodiment of the invention.
Figure 11:
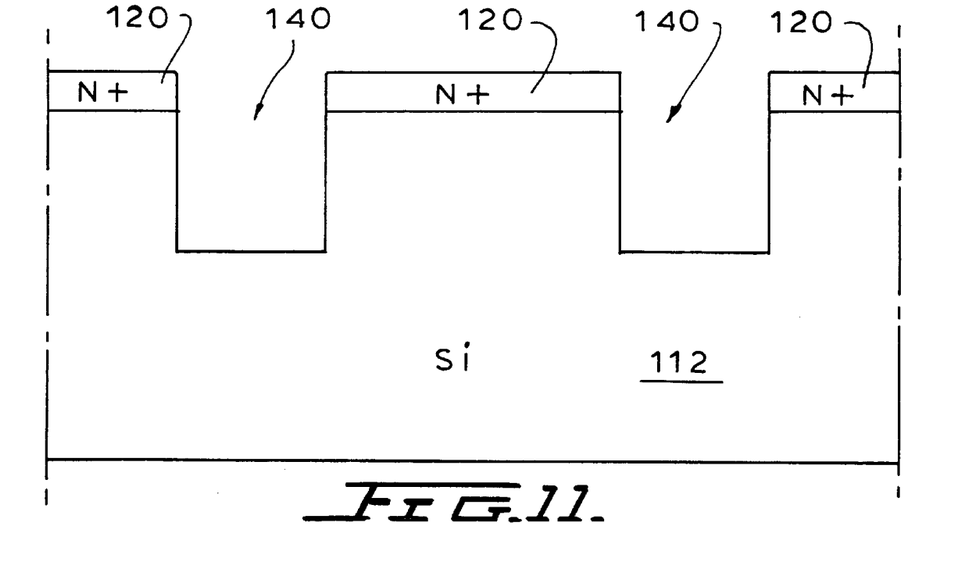

Specifically, referring to FIG. 10, in the second embodiment of the invention, processing begins with an arsenic implant at a dose of 5E15 per cm$^2$ at an energy of 80 KeV into a silicon wafer to form a 4–5 μm deep N$^+$ layer 120. POCl deposition can also be used at this step. Next, as shown in FIG. 11, a trench 140 is formed in the wafer, approximately 3 μm wide and 20 μm deep.

Figure 12:
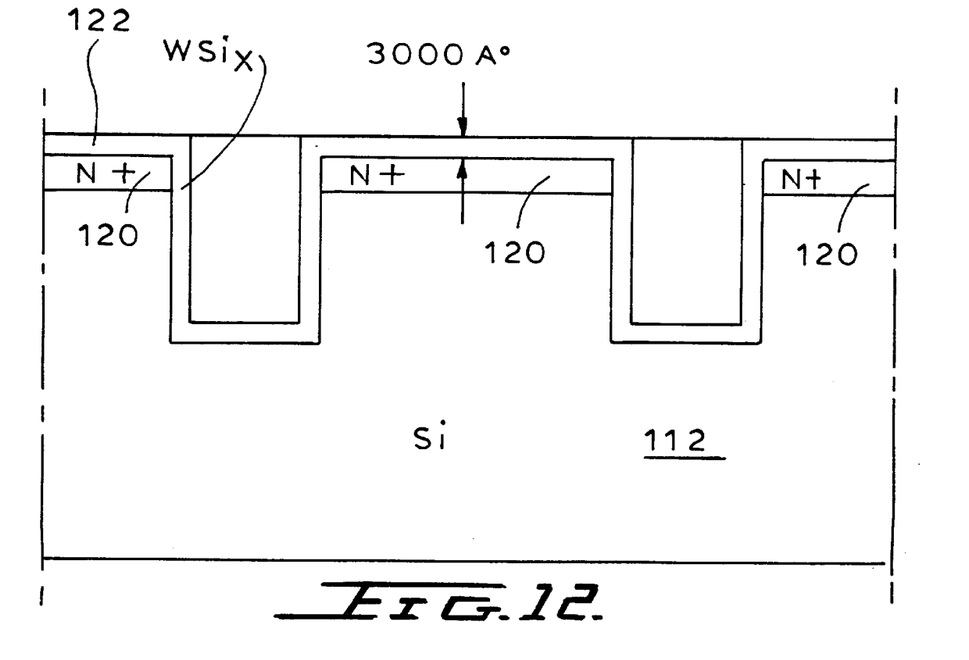
Figure 13:
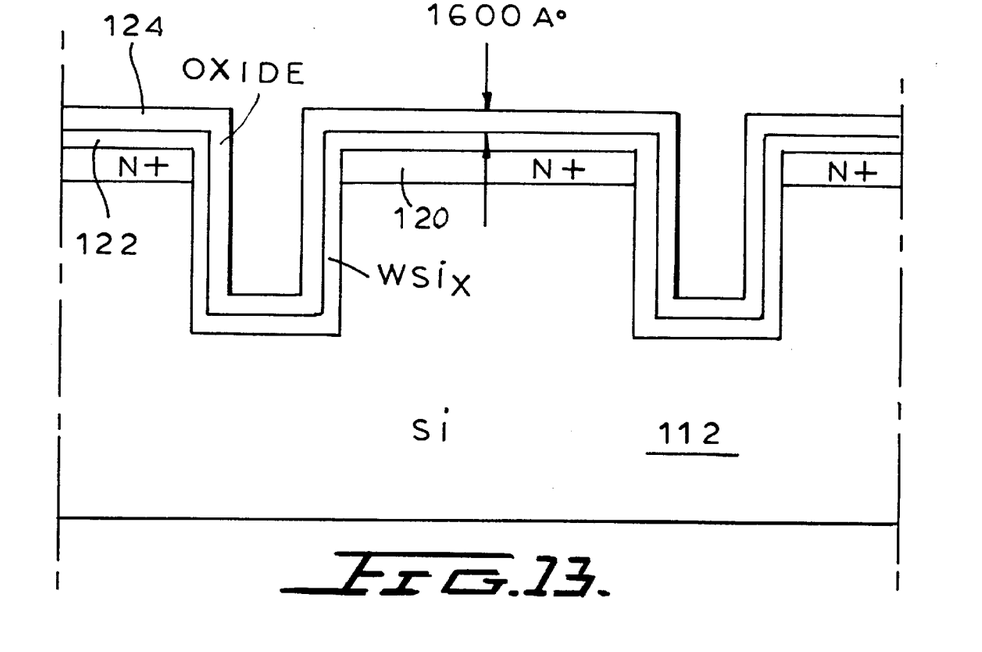

Referring to FIG. 12, a 3000 Å layer 122 of tungsten silicide (WSi$_x$) is then CVD deposited onto the wafer, the tungsten silicide layer covering not only the top surface of the wafer, but also the bottom and sidewalls of the PVG cells. Next, as shown in FIG. 13, a 1600 Å layer 124 of oxide is deposited over tungsten silicide layer 122.

Figure 14:
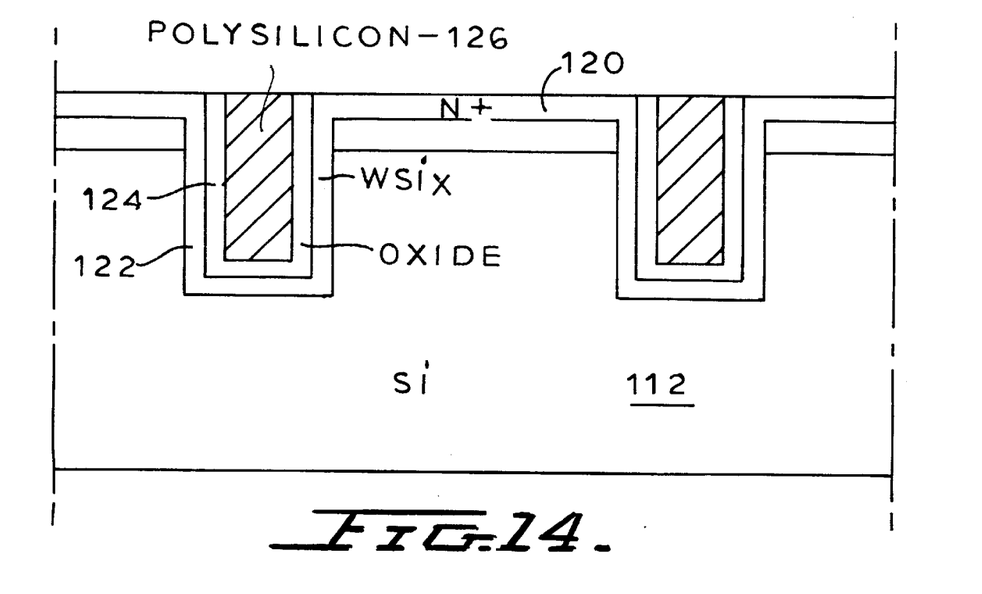
Figure 15:
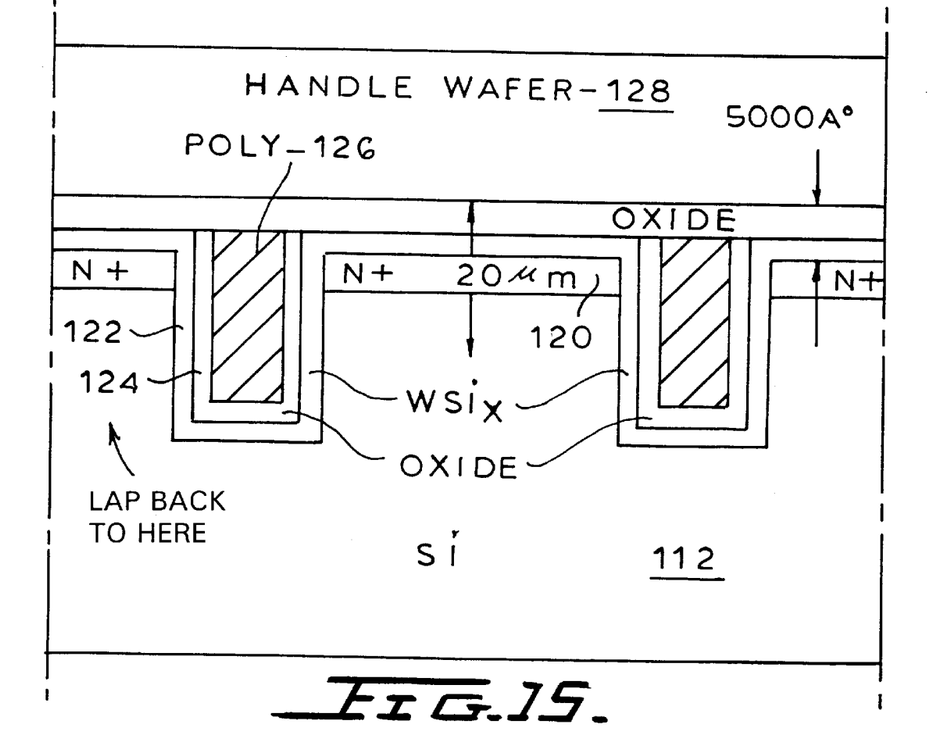
Figure 16:
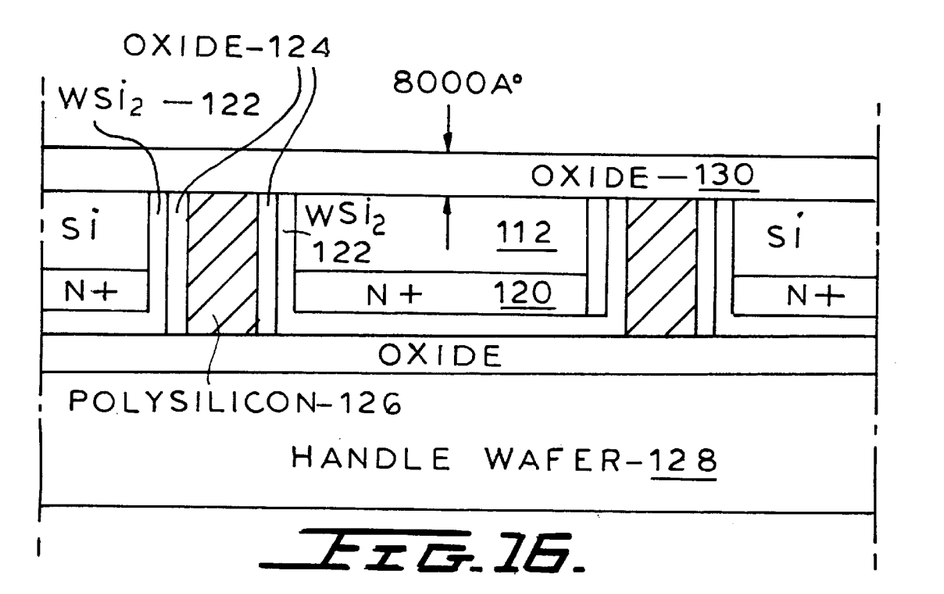

Referring now to FIG. 14, the trenches are filled with polysilicon 126 by CVD deposition, and the upper surface of the wafer is polished back to the tungsten silicide layer 122. Next, as shown in FIG. 15, the resultant structure is bonded to a handle wafer 128 with an intervening layer of oxide having a thickness of about 5000 Å. The Si wafer is then ground and lapped back to the desired thickness, shown by the dashed line in FIG. 15. Finally, an 8000 Å layer of oxide 30 is deposited over exposed wafer, with the resultant inverted structure, as shown in FIG. 16, having a reflective layer of tungsten silicide both on the bottom and on the sidewalls of the trench-isolated PVG wells. As with the first embodiment of the invention, additional processing is then done in the manner shown in FIGS. 7–9 to complete the PVG device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A photovoltaic generator comprising, in combination, a wafer comprising a bonded assembly having a relatively thick handle wafer and a relatively thin junction receiving wafer; at least a portion of said junction receiving wafer being coated with a layer of reflective material; said handle and junction receiving wafers being joined together by a thin dielectric bonding layer disposed atop said layer of reflective material; said junction receiving wafer being a lightly doped wafer of one conductivity type; a mesh-shaped thin trench which extends from an outer surface of said junction receiving wafer through said layer of reflective material, thereby dividing said wafer into a plurality of electrically insulated tubs each having a portion of said layer of reflective material at least on its bottom surface; said trench being filled with an insulator; the outer surface of each of said tubs having a relatively shallow diffusion region of an opposite conductivity type therein, whereby radiation which reaches the junction between said shallow diffusion region and said lightly doped material of said tub will generate an output photovoltaic voltage; and connector electrodes for connecting said shallow diffusion of a respective one of said tubs to the lightly doped material of an adjacent one of said tubs.

2. The photovoltaic generator of claim 1, wherein said one conductivity type is N type and said opposite conductivity type is P type.

3. The photovoltaic generator of claim 1, wherein said junction receiving wafer includes a thin high concentration buffer layer of said one conductivity type adjacent said thin dielectric bonding layer.

4. The photovoltaic generator of claim 1, wherein the walls of said trench are lined with a thin dielectric layer.

5. The photovoltaic generator of claim 1, wherein said trench is filled with a polysilicon filler.

6. The photovoltaic generator of claim 1, wherein the walls of said trench are lined with said layer of reflective material.

7. The photovoltaic generator of claim 6 wherein said further layer of reflective material is tungsten silicide.

8. The photovoltaic generator of claim 1, which includes an increased concentration contact diffusion region of said one conductivity type at the outer surface of each of said tubs, which is laterally spaced from said shallow diffusion region of said opposite conductivity type.

9. The photovoltaic generator of claim 8, wherein said contact diffusion in each of said tubs has a ring shape which surrounds and is spaced from the periphery of said diffusion of said other conductivity type.

10. The photovoltaic generator of claim 8, wherein said contact diffusion is a small area rectangle which is spaced from the periphery of said diffusion of said other conductivity type.

11. The photovoltaic generator of claim 1, wherein each of said tubs has a polygonal shape at its upper surface.

12. The photovoltaic generator of claim 1, wherein each of said tubs has a rectangular periphery.

13. The photovoltaic generator of claim 1 wherein said layer of reflective material is tungsten silicide.

14. The photoelectric generator of claim 1 wherein a thin insulation layer is deposited between said layer of reflective material and said junction receiving wafer.

15. A process for the manufacture of a photovoltaic generator comprising the steps of:

depositing a layer of reflective material atop a surface of a junction receiving wafer, said junction receiving wafer being a lightly doped wafer of one conductivity type;

joining said junction receiving wafer to a relatively thick handle wafer by a thin dielectric bonding layer such that said layer of reflective material is disposed between said thin dielectric bonding layer and said junction receiving wafer;

patterning and etching a mesh-shaped trench which extends from an outer surface of said junction receiving wafer up to said layer of reflective material, thereby dividing said wafer into a plurality of tubs;

filling said trench with an insulator;

introducing impurities of an opposite conductivity type into a region of the outer surface of each of said tubs thereby forming a relatively shallow diffusion region so that radiation which reaches the junction between said shallow diffusion region and said lightly doped material of said tub generates an output photovoltaic voltage;

depositing an overlaying insulating layer atop said outer surface of said junction receiving wafer;

patterning and etching away portions of said overlaying insulation layer to form at least one opening to said shallow diffusion region and at least one opening to said body of said lightly doped material in each of said tubs;

depositing a metal layer; and patterning and etching away portions of said metal layer to form connector electrodes that connect said shallow diffusion of a respective one of said tubs to the lightly doped material of an adjacent one of said tubs.

16. The method of claim 15 wherein said one conductivity type is N type and said opposite conductivity type is P type.

17. The method of claim 15 wherein said step of filling said trench includes lining the walls of said trench with a thin dielectric layer.

18. The method of claim 15 wherein said step of filling said trench includes filling said trench with a polysilicon filler.

19. The method of claim 15 further comprising the step of introducing impurities of said one conductivity type into a region at the outer surface of each of said tubs prior to said step of depositing said overlaying insulation layer, thereby forming an increased concentration contact diffusion region in each of said tubs which is laterally spaced from said shallow diffusion region of said opposite conductivity type.

20. The method of claim 15 further comprising the step of depositing a capping insulation layer atop said reflective layer prior to joining said handle and junction receiving wafers.

21. The method of claim 15 wherein said layer of reflective material is tungsten silicide.

22. The process of claim 15 which includes the further step of forming a thin insulation layer on the top surface of said junction receiving layer before depositing said layer of reflective material thereon.

23. A process for the manufacture of a photovoltaic generator comprising the steps of:

patterning and etching a mesh-shaped thin trench into an outer surface of a junction receiving wafer, said junction receiving wafer being a lightly doped wafer of one conductivity type;

depositing a layer of reflective material atop said outer surface of said junction receiving wafer and on at least the walls of said trench;

filling said trench with an insulator;

joining said junction receiving wafer to a relatively thick handle wafer by a thin dielectric bonding layer disposed between said outer surface of said junction receiving wafer and said handle wafer;

removing a portion of said junction receiving wafer from an opposing surface of said junction receiving wafer at least until said trench is reached;

introducing impurities of an opposite conductivity into said exposed surface of said tubs to form a relatively shallow diffusion region therein such that radiation which reaches the junction between said shallow diffusion region and said lightly doped material of said tub generates an output photovoltaic voltage;

depositing an overlaying insulating layer;

patterning and etching away portions of said overlaying insulation layer to form openings to said lightly doped material and said shallow diffusion region in each of said tubs;

depositing a connector electrode layer; and patterning and etching away portions of said connector electrode layer to form that connect electrodes that connect said shallow diffusion of a respective one of said tubs to the lightly doped material of an adjacent one of said tubs.

24. The process of claim 23 further comprising the step of introducing impurities of said one conductivity type into said outer surface of said junction receiving wafer prior to said step of depositing said layer of reflective material, thereby forming a layer of more heavily doped material in said outer surface.

25. The process of claim 23 wherein said one conductivity type is N type and said opposite conductivity type is P type.

26. The process of claim 23 wherein said step of filling said trench includes lining the walls of said trench with a thin dielectric layer.

27. The process of claim 23 wherein said step of filling said trench includes filling said trench with a polysilicon filler.

28. The process of claim 23 further comprising the step of introducing impurities of said one conductivity type into a region at the exposed surface of each of said tubs prior to said step of depositing said overlaying insulation layer, thereby forming an increased concentration contact diffusion region in each of said tubs which is laterally spaced from said shallow diffusion region of said opposite conductivity type.

29. The process of claim 23 wherein said layer of reflective material is tungsten silicide.

30. The process of claim 23 further comprising the step of depositing a further layer of insulating material atop said exposed surface of said junction receiving wafer.

31. The process of claim 23 which includes the further step of forming a thin insulation layer on the top surface of said junction receiving layer before depositing said layer of reflective material thereon.

32. A photovoltaic generator comprising, in combination, a wafer comprising a bonded assembly having a relatively thick handle wafer and a relatively thin junction receiving wafer; at least a portion of said handle wafer being coated with a layer of reflective material; said handle and junction receiving wafers being joined together by a thin dielectric bonding layer disposed atop said layer of reflective material; said junction receiving wafer being a lightly doped wafer of one conductivity type; a mesh-shaped thin trench which extends from an outer surface of said junction receiving wafer through said layer of reflective material, thereby dividing said wafer into a plurality of electrically insulated tubs each having a portion of said layer of reflective material at least on its bottom surface; said trench being filled with an insulator; the outer surface of each of said tubs having a relatively shallow diffusion region of an opposite conductivity type therein, whereby radiation which reaches the junction between said shallow diffusion region and said lightly doped material of said tub will generate an output photovoltaic voltage; and connector electrodes for connecting said shallow diffusion of a respective one of said tubs to the lightly doped material of an adjacent one of said tubs.

* * * * *